United States Patent
Weber et al.

[11] Patent Number: 5,818,112
[45] Date of Patent: Oct. 6, 1998

[54] ARRANGEMENT FOR CAPACITIVE SIGNAL TRANSMISSION BETWEEN THE CHIP LAYERS OF A VERTICALLY INTEGRATED CIRCUIT

[75] Inventors: Werner Weber; Stefan Kuehn; Michael Kleiner, all of Munich; Roland Thewes, Puchheim, all of Germany

[73] Assignee: Siemens Aktiengesellschaft, Munich, Germany

[21] Appl. No.: 549,201

[22] Filed: Oct. 27, 1995

[30] Foreign Application Priority Data

Nov. 15, 1994 [DE] Germany ................ 44 40 866.8

[51] Int. Cl.$^6$ .................... H01L 29/00; H01L 23/48; H01L 23/52; H01L 29/40
[52] U.S. Cl. ................ 257/777; 257/528; 257/532; 257/347; 438/238; 438/239
[58] Field of Search ................ 257/777, 528, 257/679, 532, 347, 352; 307/215, 228, 560, 563

[56] References Cited

U.S. PATENT DOCUMENTS

| | | | |
|---|---|---|---|
| 3,983,546 | 9/1976 | Zappe | 307/238 |
| 4,020,327 | 4/1977 | Geary et al. | 235/61.11 E |
| 4,238,841 | 12/1980 | Clemen et al. | 307/28 |
| 5,485,029 | 1/1996 | Crabbé et al. | 257/347 |

FOREIGN PATENT DOCUMENTS

| | | |
|---|---|---|
| 29 01 002 | 7/1980 | Germany . |
| 2902002 | 7/1980 | Germany . |

OTHER PUBLICATIONS

"The 3D Interconnection–Applications for Mass Memories and Microprocessors", Val et al., Proc. 24th. Symp. on ISHM, 1991, pp. 62–68.

"Future WSI Technology: Stacked Monolithic WSI," Williams et al., IEEE Trans. on CHMT, vol. 16, No. 7, pp. 610,614.

*Primary Examiner*—Mahshid D. Saadat
*Assistant Examiner*—Jhihan B. Clark
*Attorney, Agent, or Firm*—Hill & Simpson

[57] ABSTRACT

In an arrangement for signal transmission between chip layers of a vertically integrated circuit, a defined, capacitive signal transmission ensues between a part of the vertically integrated circuit in one chip layer and a further part of the vertically integrated circuit in a further chip layer by means of a coupling capacitance. Particularly given high connection densities, a large number of freely placeable and reliable vertical signal connections can be produced directly from the inside of one chip layer to the inside of a neighboring chip layer without extremely high demands being made on the adjustment of the chip layers relative to one another and on the surface planarity of the individual chip layers.

30 Claims, 4 Drawing Sheets

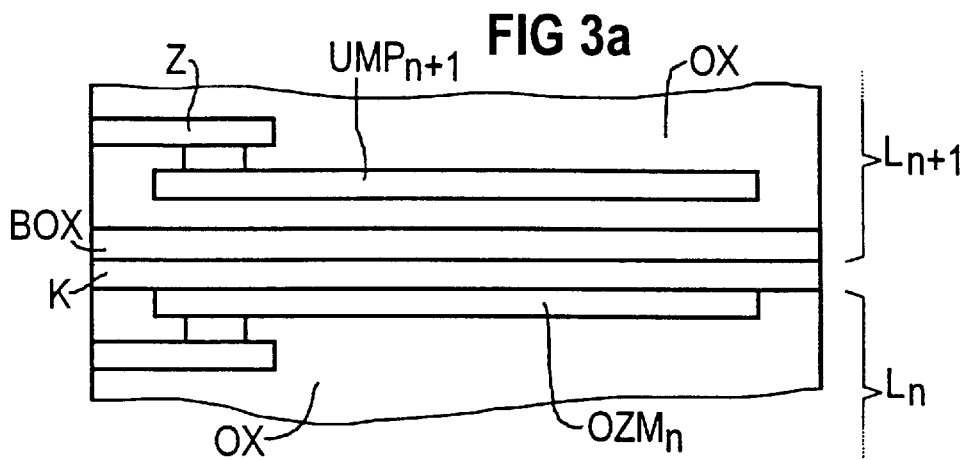
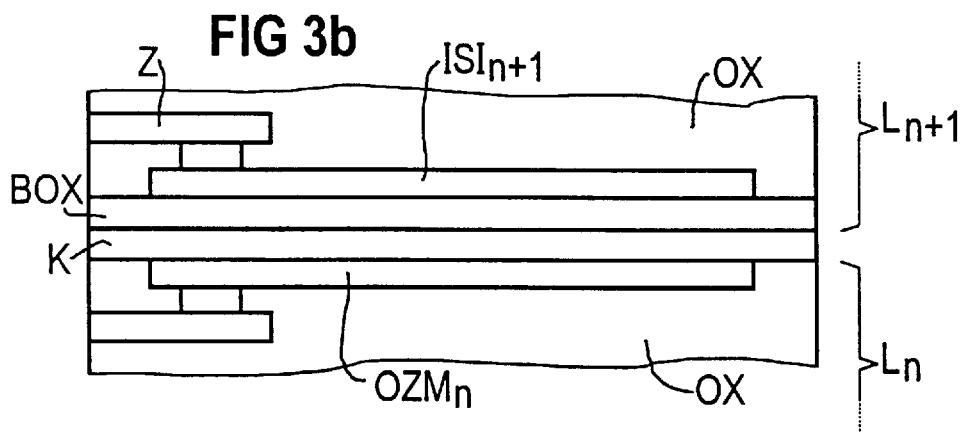
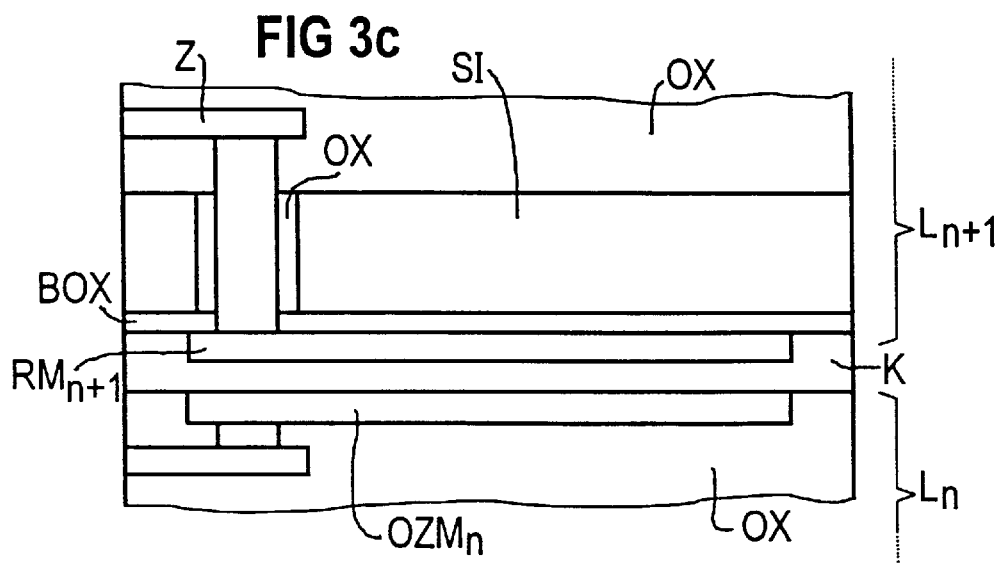

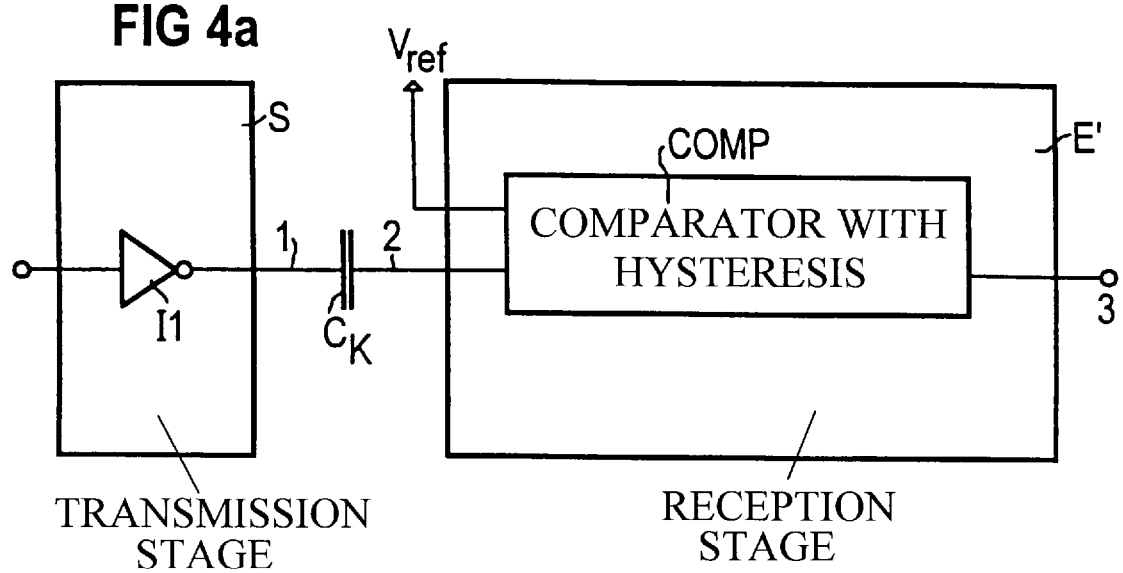
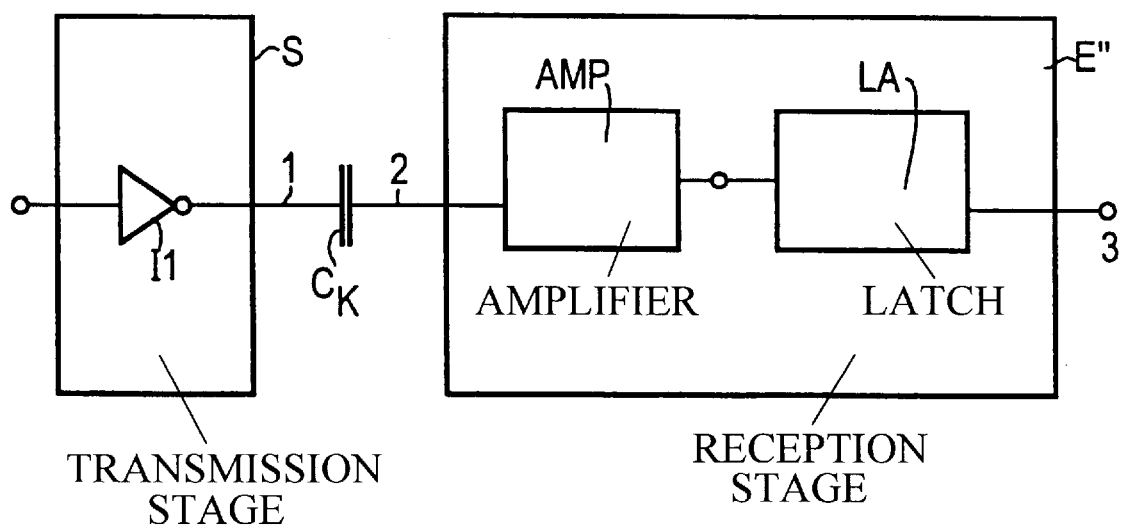

ARRANGEMENT FOR CAPACITIVE SIGNAL TRANSMISSION BETWEEN THE CHIP LAYERS OF A VERTICALLY INTEGRATED CIRCUIT

BACKGROUND OF THE INVENTION

1. Field of the Invention

The present invention is directed to a vertically integrated semiconductor ship arrangement, and to a method for making such a chip arrangement, wherein electrical signals are transmitted between circuit portions disposed in different chips.

2. Description of the Prior Art

Integrated circuits are currently manufactured primarily in planar technique. The complexity that can be achieved on a single semiconductor chip, however, is limited by the dimensions thereof and by the process technology employed for the manufacture thereof.

For enhancing the performance capability, solutions are being currently pursued wherein a number of layers of semiconductor chips are vertically integrated, i.e., layers are arranged above one another and electrically connected. In vertically integrated circuits, referred to in brief below as VICs, a three-dimensional circuit structure is composed of a stack of individual chip layers processed independently of one another, that are usually connected with glue layers. To that end, the individual chip layers can be "thinned down" to an appropriate thickness before assembly, i.e. etched down or ground down, in order to assure good electrical properties and a high connection density. In SOI technologies (silicon on insulator), the buried oxide is available as an etch stop for the "thinning" of the wafers. In conventional silicon technologies, the substrate can be thinned down to the field oxide regions or layer of MOSFETs contained in a chip layer, or may still have a substrate layer a few $\mu$m thick at the underside of the chip layers.

An arrangement for galvanic signal transmission (i.e., transmission requiring a continuous flow or transfer of charge carriers) between the chip layers of a vertically integrated circuit is known from the publication of Williams R. Marsh O., "Future WSI Technology: Stacked Monolithic WSI", IEEE Transactions on CHMT, Vol. 16, No. 7, pp. 610–614. Relatively thin chip layers having a thickness of approximately 10 $\mu$m and fine metallic connections having a diameter of approximately 1 $\mu$m are thereby required in order to assure good electrical properties of the vertical signal connections, particularly given high connection densities. A significant disadvantage of this technique, however, is that extremely high demands are made on the adjustment of the chip layers relative to one another and on the planarity of the chip surfaces.

Arrangements have therefore been recently proposed, for example in the publication by Val, C., Leroy M., "The 3D Interconnection-Applications for Mass Memories and Microprocessors", Proc. 24th Symp. on ISHM, 1991, pp. 62–68, wherein the connections from chip layer to chip layer are conducted over the lateral surfaces; this, however, has the disadvantage that the vertical connections, first, cannot be freely placed and, second, the connection are orders of magnitude longer than in the aforementioned VICs.

SUMMARY OF THE INVENTION

An object of the present invention is to provide an arrangement for signal transmission between the chip layers of a vertically integrated circuit, which permits a large number of freely placeable and reliable, vertical signal connections to be present proceeding directly from the inside of one chip layer to the inside of a neighboring chip layer, and which also permits the arrangement can to be manufactured without extremely high demands on the adjustment of the chip layers relative to one another and of the planarity of the chip surfaces.

The above object is achieved in accordance with the principles of the present invention in a vertically integrated circuit having at least first and second chip layers, wherein a coupling capacitance is provided, and signal transmission between one part of the circuit in the first chip layer and a different part of the circuit in a further chip layer takes place by capacitive coupling via the coupling capacitance.

A number of advantages are achieved with the invention. The signal reception means can be designed to function reliably for a relatively broad range of coupling capacitance. The signal transmission also functions reliably even if, surface ripple of the chip layers and irregularities of the interlayer dielectric modify the electrode spacing and, thus, the coupling capacitance or if, in the extreme case, the electrodes are even shorted. The electrodes can be designed tolerant to lateral offsets on the basis of a suitable dimensioning. The transmitter and receiver circuits respectively disposed in different chip layers enable a direct, contactless testing of individual chip layers. Complicated process steps can be avoided for the manufacture of the galvanic interchip connections in the contactless signal transmission. Signal transmission ensues without significant degradation of the bandwidth.

In a further embodiment of the invention, another coupling capacitor can be provided, allocated to the aforementioned coupling capacitor, and a complementary signal (i.e., complementary relative to the signal transmitted via the aforementioned coupling capacitor) is generated and is transmitted via the further coupling capacitor. The original signal and its complement are then differentially evaluated upon reception thereof, providing an improvement in immunity to external interference sources as well as immunity to interference arising due to cross-coupling from neighboring conductors.

DESCRIPTION OF THE DRAWINGS

FIG. 3a illustrates a first embodiment of a coupling capacitance arrangement in accordance with the principles of the present invention.

FIG. 3b illustrates a second embodiment of a coupling capacitance arrangement in accordance with the principles of the present invention.

FIG. 3c illustrates a third embodiment of a coupling capacitance arrangement in accordance with the principles of the present invention.

FIG. 4a is a block circuit diagram of an inventive arrangement with a first reception stage embodiment.

FIG. 4b is a block circuit diagram of an inventive arrangement with a second reception staged.

FIG. 5a is a detailed circuit diagram of the reception stage according to FIG. 4a.

DESCRIPTION OF THE PREFERRED EMBODIMENTS

Figure 1:
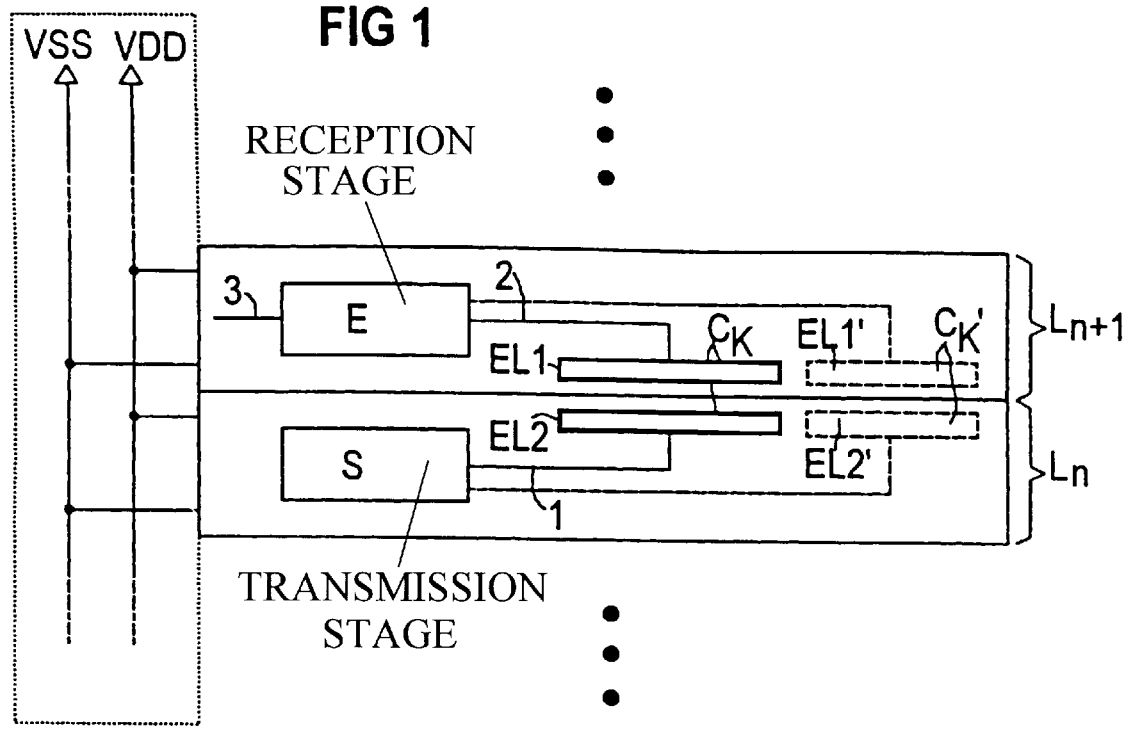
FIG. 1 illustrates an embodiment of the present invention having two neighboring chip layers of a vertically integrated circuit.

FIG. 1 shows two neighboring chip layers $L_n$ and $L_{n+1}$ of a VIC, the chip layer $L_n$ containing a transmission stage S with its output 1 connected to an electrode EL2 of a coupling capacitance $C_K$, and the chip layer $L_{n+1}$ containing the cooperating electrode EL1 of the coupling capacitance $C_K$ that is connected to an input 2 of a reception stage E, that is in turn located in the chip layer $L_{n+1}$ and has an output 3. The chip layer $L_n$ as well as the chip layer $L_{n+1}$, or the circuits contained therein, are respectively connected to supply voltage lines VDD and VSS via sidewall contacts. The coupling capacitance $C_K$ is a capacitance intentionally provided in a defined fashion, i.e., it is not a capacitance such as may arise parasitically.

Not only is there the possibility that the electrodes of the coupling capacitance can be provided in neighboring chip layers, but also the electrodes can be disposed in chip layers at a greater distance from one another, however, correspondingly large coupling capacitances can only be produced with larger electrode surfaces.

The respective allocation of the transmission stage S and the reception stage E to the chip layers $L_n$ and $L_{n+1}$ is unimportant for the invention itself, and the reception stage E may be located in the chip layer $L_n$ and the transmission stage S is located in the chip layer $L_{n+1}$.

FIG. 1 also shows a further coupling capacitance $C'_K$ and in broken lines that can be optionally provided, which has an electrode EL1' connected to the reception stage E and a further electrode EL2' connected to the transmission stage S. The further coupling capacitance $C'_K$ is used to transmit a complement to the signal transmitted via the coupling capacitance $C_K$, with the two signals then being differentially evaluated upon reception. If the result of the differential evaluation is substantially zero, this means that the two signals have been virtually identically transmitted, thereby providing a high degree of assurance that the original signal has been correctly transmitted. A differential evaluation which results in any significant deviation from zero means that one or the other of the signals has been corrupted by interference, and thus a re-transmission should take place. The use of a further coupling capacitor $C'_K$ also permits the respective values of the coupling capacitance $C_K$ and the further coupling capacitance $C'_K$ to be smaller.

Figure 2:
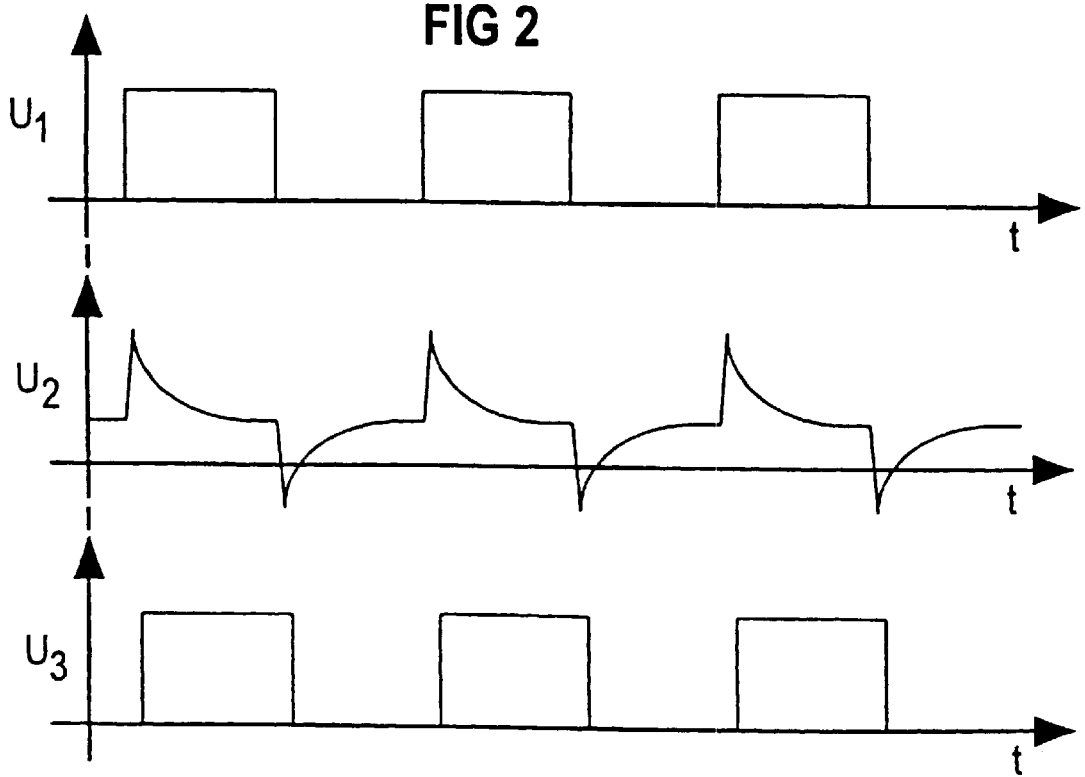
FIG. 2 is a triple voltage/time diagram for explaining the arrangement of FIG. 1.

In a triple voltage/time diagram, FIG. 2 shows a square-wave voltage $U_1$ over the time axis, this voltage $U_1$ being present at the output 1 of the transmission stage S. Further, a voltage $U_2$ is shown over the second time axis of the triple diagram, this being pending at the input 2 of the reception stage E. This voltage $U_2$ has a d.c. voltage part differing from zero that is superimposed on the voltage and that substantially corresponds to a time differentiation of the voltage $U_1$ in the time domain of the signal edges of $U_1$, whereby the signal edges of the voltage $U_1$ are highly emphasized and a nearly exponential decay or rise for the d.c. voltage part ensues. The third voltage/time diagram shows a voltage $U_3$ at the output 3 of the reception stage E that has the square-wave signal shape of the voltage $U_1$.

Various embodiments of the coupling capacitance $C_K$, or of the further coupling capacitance $C_K'$, (if present), are shown in the following FIGS. 3a, 3b and 3c. In all three embodiments, the lower electrode is respectively composed of an upper or additional metal layer $OZM_n$ of the lower chip layer. Except for a contacting region, the electrode formed of the metal layer $OZM_n$ is insulated from layers lying therebelow and toward the side by an oxide OX. The chip layer $L_n$ can be manufactured from what is referred to as an SOI wafer (silicon on insulator wafer) or from an ordinary silicon wafer. The chip layer $L_{n+1}$ is respectively mechanically connected to the chip layer $L_n$ lying therebelow via an adhesive layer K, whereby the adhesive layer K forms a dielectric for the respective coupling capacitance $C_K$ or $C'_K$ in all three instances. The arrangement shown in FIGS. 3a and 3b for the chip layer $L_{n+1}$ is a thinned SOI wafer whose buried oxide BOX is connected via an adhesive layer K to the metal layer $OZM_n$ of the chip layer $L_n$ lying therebelow. In the arrangement shown in FIG. 3a, the electrode of the chip layer $L_{n+1}$ is composed of the lowest conductive layer $UMP_{n+1}$ that, for example, is composed of metal or polysilicon and that is surrounded by an oxide OX except for a lead Z. The dielectric of the coupling capacitance in the case of FIG. 3a is thus formed of the oxide OX, the buried oxide BOX and the adhesive layer. Additional passivation and oxide layers of the lower chip layer $L_n$ which may be possibly present have been omitted in FIGS. 3a–3c.

In order to reduce the spacing between the two electrodes, an island-shaped, doped silicon region $ISI_{n+1}$ can be directly employed as the electrode EL1 alternatively to the embodiment of FIG. 3a. As shown in FIG. 3c, the chip layer $L_{n+1}$ composed of a thin silicon wafer or of an SOI wafer having a comparatively thick, remaining silicon layer SI can, as a further alternative, be formed by applying a backside metal layer $RM_{n+1}$, separated from the silicon layer Sl by an insulating oxide layer OX, on the backside of the silicon layer Sl. A connection of the electrodes to the lead Z thereby ensues in that the silicon layer Sl is punctured and a metallic through-contact is produced that is separated from the silicon layer Sl by an oxide layer. The dielectric of the coupling capacitance in this embodiment is composed only of the adhesive layer K, as a result of which the two electrodes of the coupling capacity lie comparatively closely to one another. In this latter embodiment of FIG. 3c contact between the two electrodes can easily occur, however, this is uncritical since the only concern is a reliable electrical connection between circuit parts of the two chip layers.

FIGS. 4a and 4b show the block circuit diagrams of two alternative embodiments E' and E" of the reception stage E together with the transmission stage S and the coupling capacitance $C_K$. In both instances, the transmission means S is composed of an inverter I1 whose output simultaneously forms the output 1 of the transmission stage S, which is in turn connected via the coupling capacitance $C_K$ to the input 2 of the respective reception stage E' or E".

The reception stage E' shown in FIG. 4a is a comparator COMP with hysteresis. The signal at the input 2 is compared to a reference d.c. voltage $V_{ref}$ and the status at the output 3 of the reception means E' is held by the hysteresis.

The alternative reception stage E" shown in FIG. 4b has an input 2 that is connected to an input of a pre-amplifier AMP whose output is connected to a latch LA that holds the signal at the output 3 constant when a pulse is not present at the moment at the input 2.

Figure 5A:
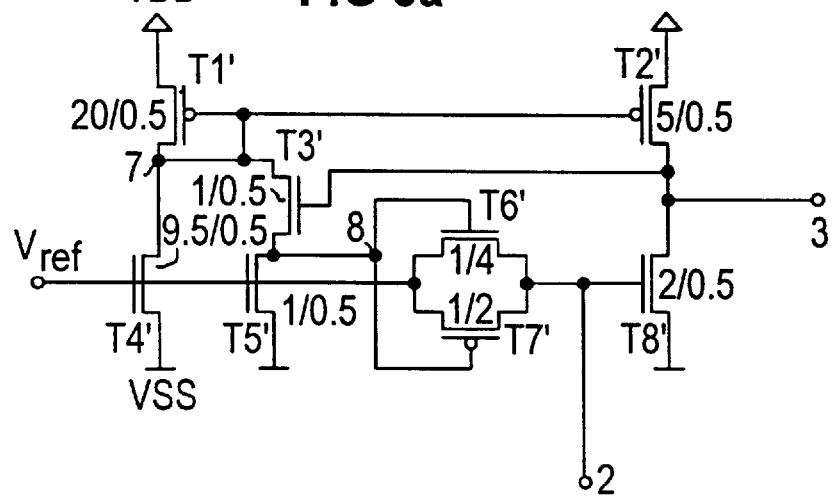

FIG. 5a shows a complete reception stage E' realized in CMOS technology having a comparator with hysteresis formed by eight MOS field effect transistors T1' . . . TA'. The transistors T1', T2' and T7' are p-channel field effect transistors and the transistors T3' . . . T6' and T8' are n-channel field effect transistors. The transistors T2' and T8' are connected in series and lie between the supply voltages VDD and VSS, and their junction represents the output 3 of the reception stage E'. The gate terminal of the transistor T8' is connected to the input 2 of the reception stage E' and is connected to the reference voltage $V_{ref}$ via the transistors T6' and T7'. The gate terminals of the transistors T6' and T7' are connected to a junction of the transistors T3' and T5'. The transistor T1' is connected in series with the transistor T4' and the series circuit of the two transistors T1' and T' lies between the supply voltages VDD and VSS. The two gate terminals of the transistors T1' and T2' are connected to the junction 7 between the two transistors T1' and T4' and, via the transistor T3', are connected to the node 8. The gate terminal of the transistor T3' is wired with the output 3 and the node 8 is connected via the transistor T8' to the supply voltage VSS.

In static operation, the transistors T4', T5' and T8' are fundamentally connected as current sources. The transistors T1' and T2' form a current mirror. The hysteresis is achieved by the activation and deactivation of the current source formed by the transistor T5' dependent on the output signal, whereby the transistor T3' is inhibited by a low level adjacent at the output 3; as a result the current mirrored to the transistor T2' is in turn so low that the transistor T8' is operated in the linear region with low drain-source voltage and the output level remains low. A high level is analogously held at the output 3. In dynamic operation, the transistors T6' and T7', which form a transfer gate, decouple the reference voltage $V_{ref}$ from the input signal 2. A signal pulse supplied via the coupling capacitance triggers a switching event of the circuit. The circuits operates with a CMOS level and the comparator is additionally supplied with a reference d.c. voltage $V_{ref}$ that amounts to approximately one volt. This reference d.c voltage $V_{ref}$ can be produced, for example, via a current mirror.

The channel widths of the transistors T1' . . . T8' amount, for example, to 20 $\mu$m, 5 $\mu$m, 1 $\mu$m, 9.5 $\mu$m, 1 $\mu$m, 1 $\mu$m, 1 $\mu$m and 2 $\mu$m in sequence. The channel length of the transistor T6' amounts, for example, to 4 $\mu$m; the channel length of the transistor T7' amounts, for example, to 2 $\mu$m; and the channel length of the remaining transistors T1' . . . T5' as well as of the transistor T8' respectively amounts to, for example, 0.5 $\mu$m. A simple inverter with an n-channel transistor that, for example, has a channel width of 2 $\mu$m and a channel length of 0.5 $\mu$m and a p-channel transistor that has a channel width of, for example, 5 $\mu$m and a channel length of, for example, 0.5 $\mu$m can be used as the transmission stage S.

Figure 5B:
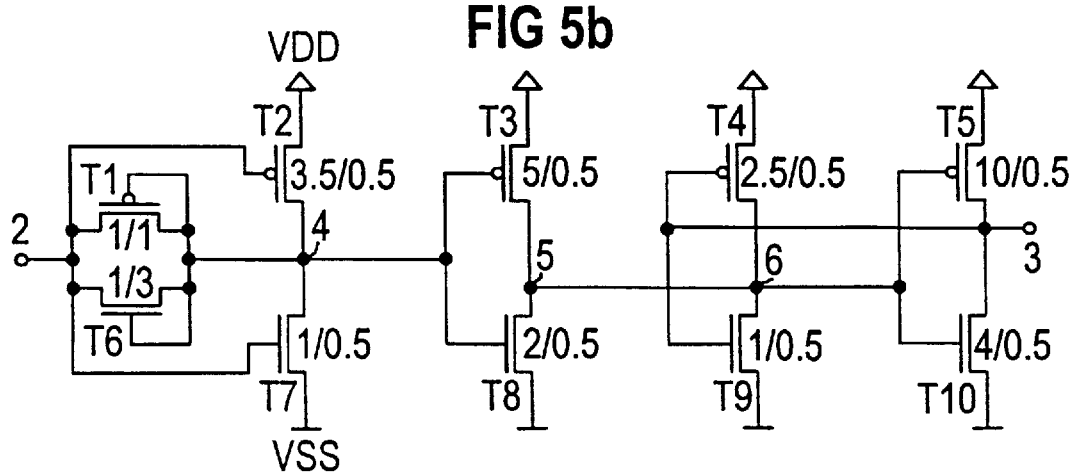
FIG. 5b is a detailed circuit diagram of the reception stage according to FIG. 4b.

A reception stage E", completely realized in CMOS technology and having a latch and a pre-amplifier is shown in FIG. 5b and is composed of ten MOS field effect transistors T1 . . . T10. The MOS field effect transistors T1 . . . T5 are p-channel field effect transistors and the transistors T6 . . . T10 are n-channel field effect transistors. The transistor pairs T2 and T7, T3 and T8, T4 and T9 as well as T5 and T10 are respectively connected in series in pairs as an inverter and lie between the supply voltages VDD and VSS. The input 2 of the reception stage E" is connected to the gate of the transistor T2, the gate of the transistor T7, as well as to the junction 4 of the two transistors T2 and T7 via the transistor T1 and the transistor T6, whereby the gate terminals of the transistors T1 and T6 are likewise connected to the junction 4 of the two transistors T2 and T7. The junction 4 between the two transistors T2 and T7 is wired both to the gate terminal of the transistor T3 as well as to the gate terminal of the transistor T8. The junction 5 between the two terminals of the transistors T3 and T5 is wired to the junction 6 of the two transistors T4 and T9 an d is connected to the gate terminals of the transistors T5 and T10. The junction between the transistor T5 and T10 represents the output 3 of the reception stage E" and is connected to the gate terminal of the transistor T4 and to the gate terminal of the transistor T9. The inverter formed of the transistors T2 and T7 is operated as an inverse feedback amplifier stage with the transistors T1 and T6 connected as a transfer gate. This forms a differentiator together with the coupling capacitance $C_K$. The upper limit frequency is defined by the gate capacitance of the transistors T1, T2, T6 and T7. This prevents an in-feed of high-frequency noise signals. Upon the arrival of a signal pulse at the input 2 of the circuit, the inverter composed of the transistors T3 and T8 amplifies the signal again, so that the latch, which is composed of the transistors T4, T5, T9 and T10, is caused to switch.

The channel widths of the transistors T1 . . . T10 can be selected as 1 $\mu$m, 3.5 $\mu$m, 5 $\mu$m, 2.5 $\mu$m, 10 $\mu$m, 1 $\mu$m, 1 $\mu$m, 2 $\mu$m, 1 $\mu$m and 4 $\mu$m in sequence. The channel length of the transistor T1 can be selected, for example, as 1 $\mu$m and the channel length of the transistor T6 can, for example, be selected as 3 $\mu$m and the remaining channel lengths can be respectively selected as 0.5 $\mu$m.

Given an electrode spacing of, for example, 1 $\mu$m, the coupling capacitance given an electrode area of 1000 $\mu m^2$ amounts to approximately 30 fF. The function of the circuit was verified for coupling capacitances down to 5 fF into the range of several hundred mHz.

A reduction of the coupling capacitance can be achieved by a complementary signal transmission and differential evaluation. Minor inclusions and variations in the electrode spacing also do not degrade the function of the signal transmission between the chip layers of the VIC.

Although modifications and changes may be suggested by those skilled in the art, it is the intention of the inventors to embody within the patent warranted hereon all changes and modifications as reasonably and properly come within the scope of their contribution to the art.

We claim as our invention:

1. A vertically integrated circuit arrangement comprising:
    a first integrated chip layer containing a first circuit portion comprising means for transmitting a signal;
    a second integrated chip layer disposed in a stack on said first integrated chip layer and containing a second circuit portion comprising means for receiving said signal;
    coupling capacitive means disposed in said stack for capacitively coupling a signal between said first and second circuit portions said coupling capacitive means comprising a first electrode disposed in said first integrated chip layer laterally of said means for transmitting and a second electrode disposed in said second integrated chip layer laterally of said means for receiving, and means for electrically insulating said first and second electrodes from each other consisting of a buried oxide layer and an adhesive layer attaching said first and second integrated chip layers to each other and forming a dielectric for said coupling capacitive means; and said means for transmitting comprising means for transmitting an original signal and a complement of said original signal, and said means for receiving comprising means for receiving said original signal and said complement of said original signal, said capacitive coupling means comprising means for capacitively coupling said original signal between said means for transmitting and said means for receiving, and said vertically integrated circuit arrangement comprising further capacitive means in said stack for capacitively coupling said complement of said original signal between said means for transmitting and said means for receiving.

2. A vertically integrated circuit arrangement as claimed in claim 1 wherein said means for receiving comprises a comparator with hysteresis.

3. A vertically integrated circuit arrangement as claimed in claim 1 wherein said means for receiving comprises a latch with a pre-amplifier.

4. A vertically integrated circuit arrangement as claimed in claim 1 comprising a conductive layer contained in said first integrated chip layer, said conductive layer comprising said first electrode.

5. A vertically integrated circuit arrangement as claimed in claim 1 comprising a highly doped silicon island region in said first integrated chip layer comprising said first electrode.

6. A vertically integrated circuit arrangement as claimed in claim 1 comprising a conductive layer disposed on a surface of said second integrated chip layer facing said first integrated chip layer and comprising said second electrode.

7. A vertically integrated circuit arrangement as claimed in claim 1 further comprising means for supplying a d.c. voltage to said first circuit portion comprising an a.c. voltage source in said second integrated chip layer and a rectifier circuit in said first integrated chip layer, and wherein said coupling capacitive means comprises means for capacitively coupling a.c. voltage from said a.c. voltage source to said rectifier circuit for rectification in said rectifier circuit to produce said d.c. voltage.

8. A vertically integrated circuit arrangement as claimed in claim 4 wherein said conductive layer comprises a polysilicon layer.

9. A vertically integrated circuit arrangement as claimed in claim 4 wherein said conductive layer comprises a metal layer.

10. A vertically integrated circuit arrangement comprising:
   a first integrated chip layer containing a first circuit portion comprising means for transmitting comprises means for transmitting an original signal and a complement of said original signal;
   a second integrated chip layer containing a second circuit portion comprising means for receiving said original signal and said complement of said original signal;
   first coupling capacitive means for capacitively coupling said original signal between said means for transmitting and said means for receiving said first coupling capacitive means comprising a first electrode disposed in said first integrated chip layer laterally of said means for transmitting and a second electrode disposed in said second integrated chip layer laterally of said means for receiving, and means for electrically insulating said first and second electrodes from each other; and
   second coupling capacitive means for capacitively coupling said complement of said original signal between said means for transmitting and said means for receiving, said second coupling capacitive means comprising a further first electrode disposed laterally of said first electrode in said first integrated chip layer and a further second electrode disposed laterally of said second electrode in said second integrated chip layer, and means for electrically insulating said further first electrode and said further second electrode from each other, said means for electrically insulating said further first electrode and said further second electrode from each other consist of a buried oxide layer and an adhesive layer attaching said first and second integrated chip layers to each other and forming a dielectric for said second coupling capacitive means.

11. A vertically integrated circuit arrangement as claimed in claim 10 further comprising a conductive layer disposed in said first integrated chip layer, said first electrode and said further first electrode comprising respective portions of said conductive layer.

12. A vertically integrated circuit arrangement as claimed in claim 11 wherein said conductive layer comprises a polysilicon layer.

13. A vertically integrated circuit arrangement as claimed in claim 11 wherein said conductive layer comprises a metal layer.

14. A vertically integrated circuit arrangement as claimed in claim 10 comprising highly doped silicon island regions disposed in said first integrated chip layer and respectively comprising said first electrode and said further first electrode.

15. A vertically integrated circuit arrangement as claimed in claim 10 comprising a conductive layer disposed on a surface of said second integrated chip layer facing said first integrated chip layer, said second electrode and said further second electrode comprising respective portions of said conductive layer.

16. A vertically integrated circuit arrangement comprising:
   a first integrated chip layer containing a first circuit portion comprising means for transmitting a signal;
   a second integrated chip layer disposed in a stack on said first integrated chip layer and containing a second circuit portion comprising means for receiving said signal;
   coupling capacitive means disposed in said stack for capacitively coupling a signal between said first and second circuit portions said coupling capacitive means comprising a first electrode disposed in said first integrated chip layer laterally of said means for transmitting and a second electrode disposed in said second integrated chip layer laterally of said means for receiving, and means for electrically insulating said first and second electrodes from each other consisting of an adhesive layer attaching said first and second integrated chip layers to each other and forming a dielectric for said coupling capacitive means; said means for transmitting comprising means for transmitting an original signal and a complement of said original signal, and said means for receiving comprising means for receiving said original signal and said complement of said original signal, said capacitive coupling means comprising means for capacitively coupling said original signal between said means for transmitting and said means for receiving, and said vertically integrated circuit arrangement comprising further capacitive means in said stack for capacitively coupling said complement of said original signal between said means for transmitting and said means for receiving.

17. A vertically integrated circuit arrangement as claimed in claim 16 wherein said means for receiving comprises a comparator with hysteresis.

18. A vertically integrated circuit arrangement as claimed in claim 16 wherein said means for receiving comprises a latch with a pre-amplifier.

19. A vertically integrated circuit arrangement as claimed in claim 16 comprising a conductive layer contained in said first integrated chip layer, said conductive layer comprising said first electrode.

20. A vertically integrated circuit arrangement as claimed in claim 16 comprising a highly doped silicon island region in said first integrated chip layer comprising said first electrode.

21. A vertically integrated circuit arrangement as claimed in claim 16 comprising a conductive layer disposed on a surface of said second integrated chip layer facing said first integrated chip layer and comprising said second electrode.

22. A vertically integrated circuit arrangement as claimed in claim 16 further comprising means for supplying a d.c. voltage to said first circuit portion comprising an a.c. voltage source in said second integrated chip layer and a rectifier circuit in said first integrated chip layer, and wherein said coupling capacitive means comprises means for capacitively coupling a.c. voltage from said a.c. voltage source to said rectifier circuit for rectification in said rectifier circuit to produce said d.c. voltage.

23. A vertically integrated circuit arrangement as claimed in claim 19 wherein said conductive layer comprises a polysilicon layer.

24. A vertically integrated circuit arrangement as claimed in claim 19 wherein said conductive layer comprises a metal layer.

25. A vertically integrated circuit arrangement comprising:

a first integrated chip layer containing a first circuit portion comprising means for transmitting comprises means for transmitting an original signal and a complement of said original signal;

a second integrated chip layer containing a second circuit portion comprising means for receiving said original signal and said complement of said original signal;

first coupling capacitive means for capacitively coupling said original signal between said means for transmitting and said means for receiving, said first coupling capacitive means comprising a first electrode disposed in said first integrated chip layer laterally of said means for transmitting and a second electrode disposed in said second integrated chip layer laterally of said means for receiving, and means for electrically insulating said first and second electrodes from each other; and second coupling capacitive means for capacitively coupling said complement of said original signal between said means for transmitting and said means for receiving, said second coupling capacitive means comprising a further first electrode disposed laterally of said first electrode in said first integrated chip layer and a further second electrode disposed laterally of said second electrode in said second integrated chip layer, and means for electrically insulating said further first electrode and said further second electrode from each other, said means for electrically insulating said further first electrode and said further second electrode from each other consist of an adhesive layer attaching said first and second integrated chip layers to each other and forming a dielectric for said second coupling capacitive means.

26. A vertically integrated circuit arrangement as claimed in claim 25 further comprising a conductive layer disposed in said first integrated chip layer, said first electrode and said further first electrode comprising respective portions of said conductive layer.

27. A vertically integrated circuit arrangement as claimed in claim 26 wherein said conductive layer comprises a polysilicon layer.

28. A vertically integrated circuit arrangement as claimed in claim 25 comprising highly doped silicon island regions disposed in said first integrated chip layer and respectively comprising said first electrode and said further first electrode.

29. A vertically integrated circuit arrangement as claimed in claim 25 comprising a conductive layer disposed on a surface of said second integrated chip layer facing said first integrated chip layer, said second electrode and said further second electrode comprising respective portions of said conductive layer.

30. A vertically integrated circuit arrangement as claimed in claim 26 wherein said conductive layer comprises a metal layer.

* * * * *